(12) United States Patent
SU et al.

(10) Patent No.: US 10,854,748 B2
(45) Date of Patent: Dec. 1, 2020

(54) SEMICONDUCTOR DEVICE HAVING FIRST AND SECOND EPITAXIAL MATERIALS

(71) Applicant: TAIWAN SEMICONDUCTOR MANUFACTURING COMPANY, LTD., Hsinchu (TW)

(72) Inventors: Lilly SU, ChuBei (TW); Pang-Yen Tsai, Jhu-bei (TW); Tze-Liang Lee, Hsinchu (TW); Chii-Horng Li, Jhu-Bei (TW); Yen-Ru Lee, Hsinchu (TW); Ming-Hua Yu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/837,546

(22) Filed: Dec. 11, 2017

(65) Prior Publication Data

US 2018/0108777 A1    Apr. 19, 2018

Related U.S. Application Data

(60) Continuation of application No. 15/209,103, filed on Jul. 13, 2016, now Pat. No. 9,842,930, which is a
(Continued)

(51) Int. Cl.
*H01L 29/78* (2006.01)
*H01L 21/8234* (2006.01)
(Continued)

(52) U.S. Cl.
CPC .. *H01L 29/7848* (2013.01); *H01L 21/823412* (2013.01); *H01L 21/823418* (2013.01);
(Continued)

(58) Field of Classification Search
CPC ......... H01L 29/7848; H01L 21/823412; H01L 21/823418
See application file for complete search history.

(56) References Cited

U.S. PATENT DOCUMENTS

2004/0227164 A1    11/2004   Lee et al.
2005/0181552 A1    8/2005    Koyama
(Continued)

FOREIGN PATENT DOCUMENTS

CN    103035526    4/2013
JP    2008-171999  7/2008
(Continued)

OTHER PUBLICATIONS

Notice of Allowance dated May 22, 2013 and English translation from corresponding No. KR 10-2011-0133645.

*Primary Examiner* — Errol V Fernandes
(74) *Attorney, Agent, or Firm* — Hauptman Ham, LLP

(57) ABSTRACT

A semiconductor device includes a first gate stack over a substrate. The semiconductor device further includes a first epitaxial (epi) material in the substrate on a first side of the first gate stack. The first epi material includes a first upper surface having a first crystal plane. The semiconductor device further includes a second epi material in the substrate on a second side of the first gate stack opposite the first side. The second epi material includes a second upper surface having a second crystal plane, and the first crystal plane is different from the second crystal plane.

20 Claims, 9 Drawing Sheets

Related U.S. Application Data division of application No. 14/567,329, filed on Dec. 11, 2014, now Pat. No. 9,401,426, which is a division of application No. 13/252,346, filed on Oct. 4, 2011, now Pat. No. 8,927,374.

(51) Int. Cl.

| | | |
|---|---|---|
| *H01L 21/8238* | (2006.01) | |
| *H01L 29/66* | (2006.01) | |
| *H01L 29/08* | (2006.01) | |
| *H01L 29/04* | (2006.01) | |
| *H01L 27/06* | (2006.01) | |
| *H01L 29/06* | (2006.01) | |

(52) U.S. Cl.
CPC ............ *H01L 21/823425* (2013.01); *H01L 21/823481* (2013.01); *H01L 21/823807* (2013.01); *H01L 21/823814* (2013.01); *H01L 21/823878* (2013.01); *H01L 27/0617* (2013.01); *H01L 29/045* (2013.01); *H01L 29/0653* (2013.01); *H01L 29/0843* (2013.01); *H01L 29/66636* (2013.01); *H01L 29/66659* (2013.01); *H01L 29/7835* (2013.01)

(56) References Cited

U.S. PATENT DOCUMENTS

| | | | |
|---|---|---|---|
| 2008/0237634 A1* | 10/2008 | Dyer | ............ H01L 21/82341 257/190 |
| 2008/0277735 A1 | 11/2008 | Ko et al. | |
| 2009/0095992 A1 | 4/2009 | Sanuki et al. | |
| 2009/0101942 A1 | 4/2009 | Dyer | |
| 2010/0093147 A1* | 4/2010 | Liao | ............ H01L 21/28123 438/300 |
| 2010/0327329 A1 | 12/2010 | Itokawa | |
| 2012/0280251 A1* | 11/2012 | Dube | ............ H01L 29/66628 257/77 |

FOREIGN PATENT DOCUMENTS

| | | |
|---|---|---|
| JP | 2009-43916 | 2/2009 |
| KR | 10-2006-0076150 | 7/2006 |

\* cited by examiner

SEMICONDUCTOR DEVICE HAVING FIRST AND SECOND EPITAXIAL MATERIALS

PRIORITY CLAIM

The present application is a continuation of U.S. application Ser. No. 15/209,103, filed Jul. 13, 2016, which is a divisional of U.S. application Ser. No. 14/567,329, filed Dec. 11, 2014, now U.S. Pat. No. 9,401,426, issued Jul. 26, 2016, which is a divisional of U.S. application Ser. No. 13/252,346, filed Oct. 4, 2011, now U.S. Pat. No. 8,927,374, issued Jan. 6, 2015, which are incorporated herein by reference in their entireties.

FIELD

The disclosure relates to integrated circuit fabrication and, more particularly, to a semiconductor device with a strained structure.

BACKGROUND

When a semiconductor device, such as a metal-oxide-semiconductor field-effect transistor (MOSFET), is scaled down through various technology nodes, high-k gate dielectric layers and metal gate electrode layers are incorporated into the gate stack of the MOSFET to improve device performance with the decreased feature sizes. In addition, strained structures in source and drain (S/D) recess cavities of the MOSFET utilizing selectively grown silicon germanium (SiGe) may be used to enhance carrier mobility.

However, there are challenges to implement such features and processes in complementary metal-oxide-semiconductor (CMOS) fabrication. As the gate length and spacing between devices decrease, these problems are exacerbated. For example, it is difficult to achieve enhanced carrier mobility for a semiconductor device, because strained materials cannot deliver a given amount of strain into the channel region of the semiconductor device, thereby increasing the likelihood of device instability and/or device failure.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the relative dimensions of the various features may be arbitrarily increased or reduced for clarity of discussion.

DESCRIPTION

Figure 1:
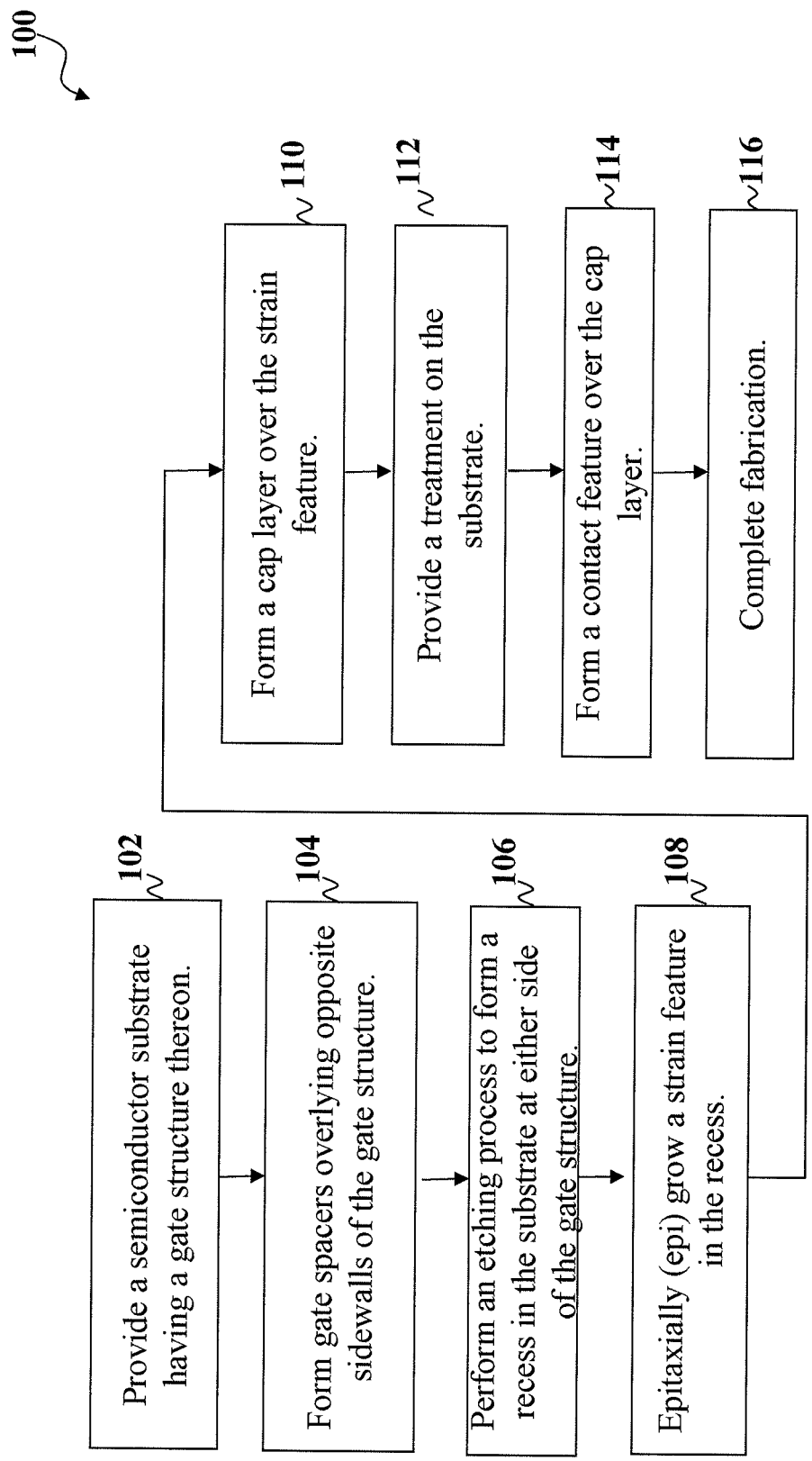
FIG. 1 is a flowchart illustrating a method for fabricating a semiconductor device comprising a strained structure according to various aspects of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flowchart illustrating a method 100 for fabricating a semiconductor device 200 according to various aspects of the present disclosure. FIGS. 2-8 show schematic cross-sectional views of a semiconductor device 200 at various stages of fabrication according to an embodiment of the method 100 of FIG. 1. The semiconductor device 200 may be included in a microprocessor, memory cell, and/or other integrated circuit (IC). It is noted that the method of FIG. 1 does not produce a completed semiconductor device 200. A completed semiconductor device 200 may be fabricated using complementary metal-oxide-semiconductor (CMOS) technology processing. Accordingly, it is understood that additional processes may be provided before, during, and after the method 100 of FIG. 1, and that some other processes may only be briefly described herein. Also, FIGS. 1 through 8 are simplified for a better understanding of the present disclosure. For example, although the figures illustrate the semiconductor device 200, it is understood the IC may comprise a number of other devices comprising resistors, capacitors, inductors, fuses, etc.

Figure 2:
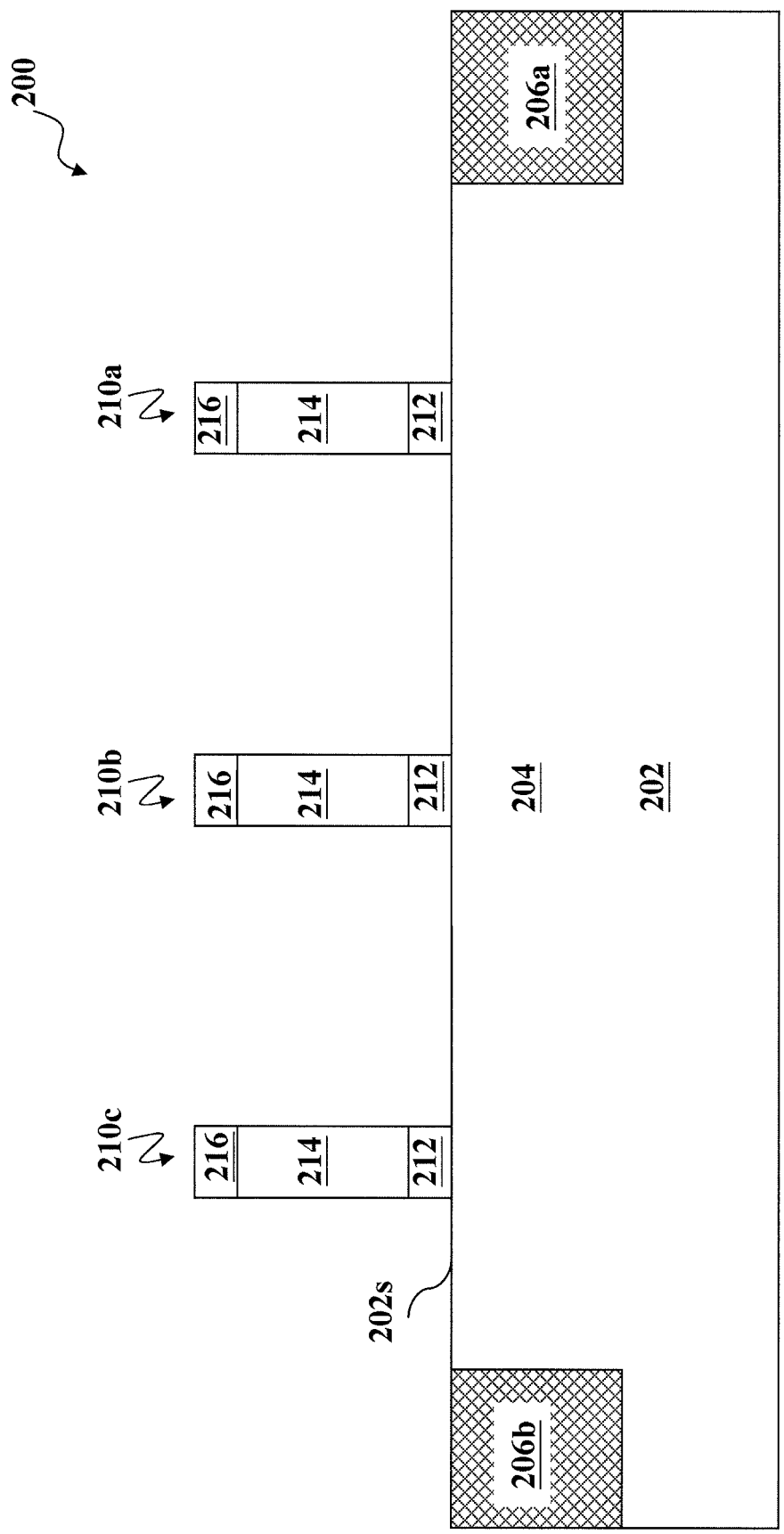
FIGS. 2-5, 5A and 6-8 show schematic cross-sectional views of a strained structure of a semiconductor device at various stages of fabrication according to various aspects of the present disclosure.

Referring to FIGS. 1 and 2, the method 100 begins at step 102 wherein a substrate 202 comprising a surface 202s is provided. In one embodiment, the substrate 202 comprises a crystalline silicon substrate (e.g., wafer). In the present embodiment, the substrate 202 is referred to as a (100) substrate having the surface 202s formed of the (100) crystal plane. In an alternative embodiment, the substrate 202 may include a silicon-on-insulator (SOI) structure.

The substrate 202 may further comprise active regions 204. The active regions 204 may include various doping configurations depending on design requirements. In some embodiments, the active regions 204 may be doped with p-type or n-type dopants. For example, the active regions 204 may be doped with p-type dopants, using a chemical such as boron or $BF_2$ to perform the doping; n-type dopants, using a chemical such as phosphorus or arsenic to perform the doping; and/or combinations thereof. The active regions 204 may act as regions configured for a N-type metal-oxide-semiconductor transistor device (referred to as an NMOS) and regions configured for a P-type metal-oxide-semiconductor transistor device (referred to as a PMOS).

In some embodiments, isolation structures 206a and 206b are formed in the substrate 202 to isolate the various active regions 204. The isolation structures 206a and 206b, for example, are formed using isolation technology, such as local oxidation of silicon (LOCOS) or shallow trench isolation (STI), to define and electrically isolate the various active regions 204. In the present embodiment, the isolation structures 206a and 206b include a STI. The isolation structures 206a and 206b may comprise silicon oxide, silicon nitride, silicon oxynitride, fluoride-doped silicate glass (FSG), a low-K dielectric material, other suitable materials, and/or combinations thereof. The isolation structures 206a and 206b, and in the present embodiment the STI, may be formed by any suitable process. As one example, the formation of the STI may include patterning the semiconductor substrate 202 by a photolithography process, etching a trench in the substrate 202 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

Still referring to FIG. 2, in at least one embodiment, gate stacks 210a, 210b, and 210c are formed over the surface 202s of the substrate 202. In some embodiments, the gate stacks 210a, 210b, and 210c are formed by sequentially depositing and patterning a gate dielectric layer 212, a gate electrode layer 214, and a hard mask layer 216 on the substrate 202.

The gate dielectric layer 212, in one example, is a thin film comprising silicon oxide, silicon nitride, silicon oxynitride, high-k dielectrics, other suitable dielectric materials, or combinations thereof. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the gate dielectric layer 212 is a high-k dielectric layer with a thickness in the range of about 10 angstroms to about 30 angstroms. The gate dielectric layer 212 may be formed using a suitable process such as atomic layer deposition (ALD), chemical vapor deposition (CVD), physical vapor deposition (PVD), thermal oxidation, UV-ozone oxidation, or combinations thereof. The gate dielectric layer 212 may further comprise an interfacial layer (not shown) to reduce damage between the gate dielectric layer 212 and substrate 202. The interfacial layer may comprise silicon oxide.

The gate electrode layer 214 is then formed on the gate dielectric layer 212. In some embodiments, the gate electrode layer 214 may comprise a single layer or multilayer structure. In the present embodiment, the gate electrode layer 214 may comprise polysilicon. Further, the gate electrode layer 214 may be doped polysilicon with the same or different doping species. In one embodiment, the gate electrode layer 214 has a thickness in the range of about 30 nm to about 60 nm. The gate electrode layer 214 may be formed using a process such as low-pressure chemical vapor deposition (LPCVD), plasma enhanced chemical vapor deposition (PECVD), other suitable processes, or combinations thereof.

Next, the hard mask layer 216 is formed over the gate electrode layer 214 and a patterned photo-sensitive layer (not shown) is formed on the hard mask layer 216. The pattern of the photo-sensitive layer is transferred to the hard mask layer 216 and then transferred to the gate electrode layer 214 and gate dielectric layer 212 to form the gate stacks 210a, 210b, and 210c over the surface 202s of the substrate 202. In some embodiments, the hard mask layer 216 comprises silicon oxide. Alternatively, the hard mask layer 216 may comprise silicon nitride, silicon oxynitride, and/or other suitable dielectric materials, and may be formed using a method such as CVD or PVD. The hard mask layer 216 has a thickness in the range from about 100 angstroms to about 800 angstroms. The photo-sensitive layer is stripped thereafter by a dry and/or wet stripping process.

Figure 3:
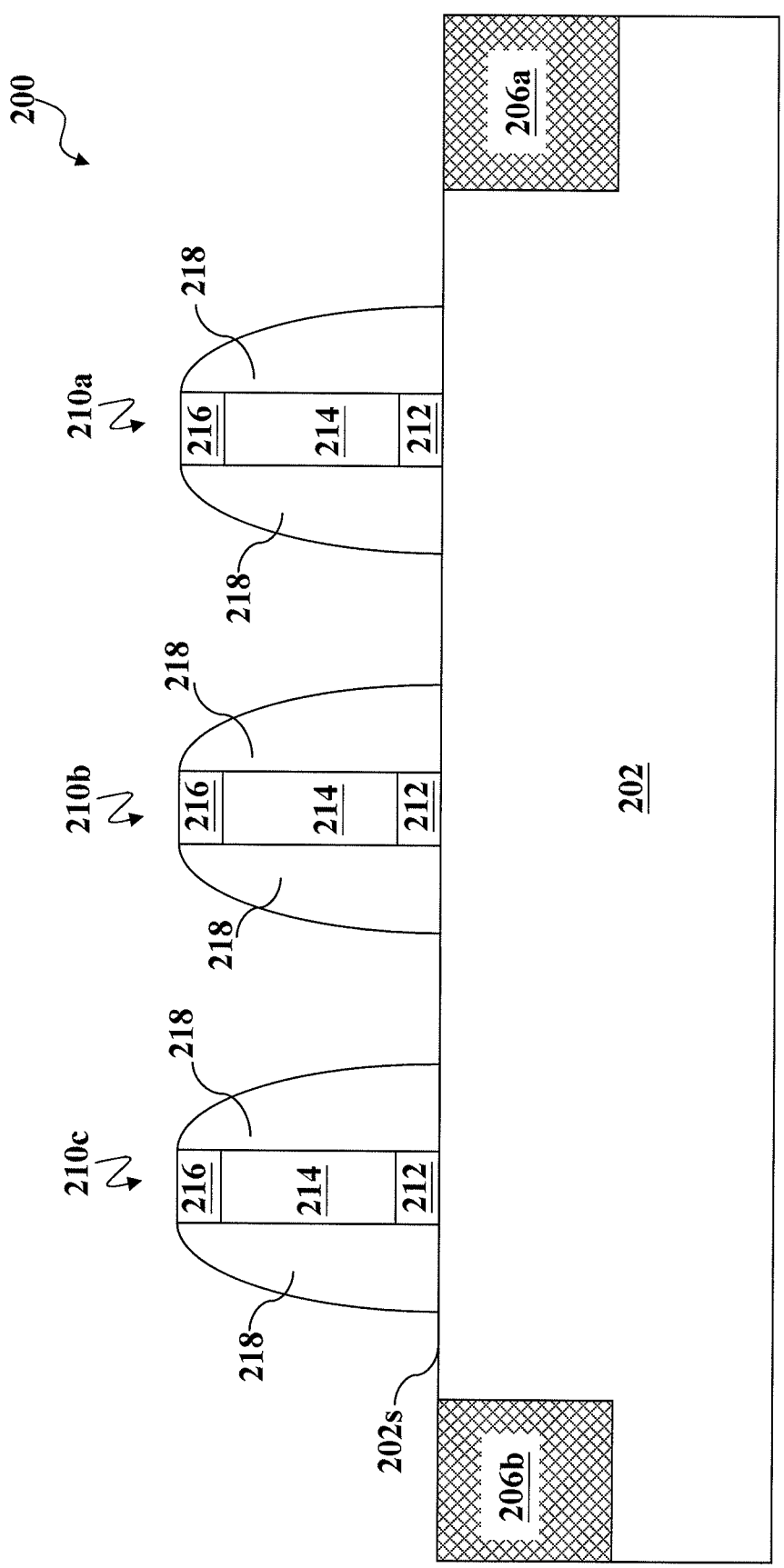

Referring to FIGS. 1 and 3, the method 100 proceeds to step 104 wherein gate spacers 218 are formed overlying opposite sidewalls of the gate stacks 210a, 210b, and 210c. In the present embodiment, the gate spacers 218 adjoin sidewalls of the gate stacks 210a, 210b. In some embodiments, the gate spacers 218 may include a single-layer or a multiple-layer structure. In the present embodiment, a blanket layer of spacer material (not shown) is formed over the gate stacks 210a, 210b, and 210c by a deposition process including CVD, PVD, ALD, or other suitable techniques. In some embodiments, the spacer material comprises silicon oxide, silicon nitride, silicon oxynitride, other suitable material, or combinations thereof. In some embodiments, the spacer material has a thickness ranging from about 5 nm to about 15 nm. Then, an anisotropic etching is performed on the spacer material to form the gate spacers 218.

Figure 4:
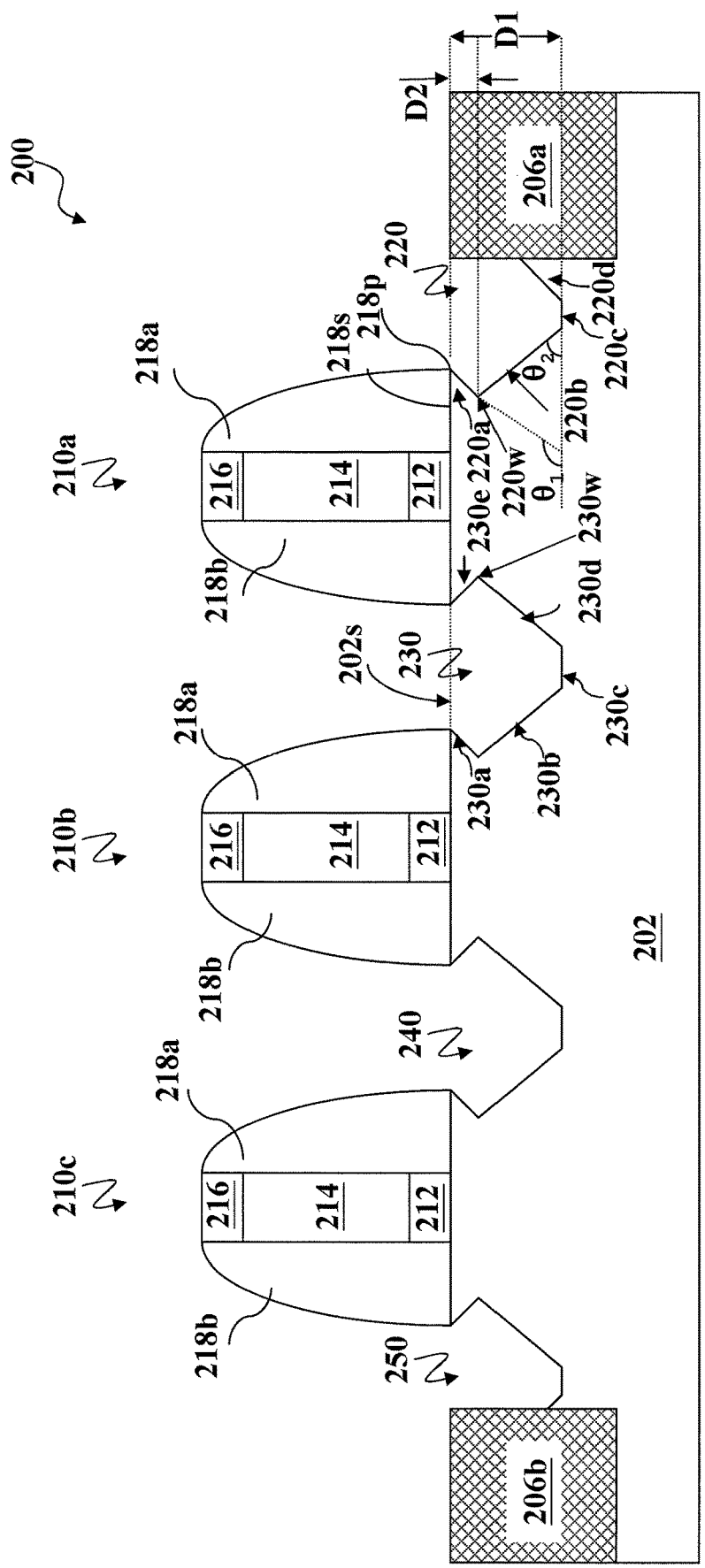

Referring to FIGS. 1 and 4, the method 100 continues with step 106 in which the substrate 202 is recessed to form recess cavities 220, 230, 240, and 250 in the substrate 202. In some embodiments, the recess cavities 220, 230, 240, and 250 are source and drain (S/D) recess cavities. In the structure of FIG. 4, the recess cavities 220 and 250 are formed between the gate stack 210a/the isolation structure 206a and the gate stack 210c/the isolation structure 206b, respectively. The recess cavities 230 and 240 are formed between the gate stacks 210a/210b and 210b/210c, respectively.

In the present embodiment, the processes for forming the recess cavities 220, 230, 240, and 250 are started using an isotropic dry etching process, followed by an anisotropic wet or dry etching process. In some embodiments, the isotropic dry etching process is performed using the gate spacers 218 and isolation structures 206a and 206b as hard masks to recess the surface 202s of the substrate 202 that is unprotected by the gate spacers 218 or the isolation structures 206a and 206b to form initial recess cavities (not shown) in the substrate 202. In an embodiment, the isotropic dry etching process may be performed under a pressure of about 1 mTorr to about 1000 mTorr, a power of about 50 W to about 1000 W, a bias voltage of about 20 V to about 500 V, at a temperature of about 40° C. to about 60° C., using HBr and/or $Cl_2$ as etch gases. Also, in the embodiments provided, the bias voltage used in the isotropic dry etching process may be tuned to allow better control of an etching direction to achieve desired profiles for the S/D recess regions.

In some embodiments, a wet etching process is then provided to enlarge the initial recess cavities to form the recess cavities 220, 230, 240, and 250. In some embodiments, the wet etching process is performed using a chemical comprising hydration tetramethyl ammonium (TMAH), or the like. As a result of such etching processes, there may be formed a plurality of facets in each recess cavities 220, 230, 240, and 250. It should be noted that periphery environment with or without an etch stop can influence resultant features of the S/D recess cavities 220, 230, 240, and 250. During the wet etching process, the isolation structure 206a may function as an etch stop for defining the recess cavity 220 between the gate stack 210a and isolation structure 206a. In some embodiments, the recess cavity 220 between the gate stack 210a and isolation structure 206a have respective sidewall surfaces defined by a bottom facet 220c, an upper sidewall facet 220a, lower sidewall facets 220b and 220d, and an upper portion of the sidewall of the isolation structure 206a. Thereby, the facet 220a and facet 220b thus formed intersect each other and together define a wedge 220w in the recess cavity 220, such that the wedge-shaped recess cavity 220 extends into the substrate 202 in the region right underneath the spacer 218 toward the channel region. In some embodiments, the recess cavity 230 between the adjacent gate stacks 210a and 210b, without an etch stop, have respective sidewall surfaces each defined by a bottom facet 230c, upper sidewall facets 230a, 230e, and lower sidewall facets 230b and 230d. Thereby, the facet 230d and facet 230e thus formed intersect each other and together define a wedge 230w in the recess cavity 230, such that the wedge-shaped recess cavity 230 extends into the substrate 202 in the region right underneath the spacer 218 toward the channel region.

In the illustrated example, the bottom facets 220c, 230c are formed of (100) crystal plane parallel to the crystal plane of the surface 202s of the substrate 202. In the illustrated example, the upper sidewall facets 220a, 230a, and 230e and the lower sidewall facets 220b, 220d, 230b, and 230d are formed of (111) crystal plane, and the upper sidewall facets 220a and 230a form an angle $\theta_1$ to the bottom facets 220c and 230c. Further, the lower sidewall facets 220b and 230b form a smaller angle $\theta_2$ than the angle $\theta_1$ with respect to the bottom facets 220c and 230c. In the structure of FIG. 4, the angle $\theta_1$ takes the range of about 90 degrees to about 150 degrees, while the angle $\theta_2$ takes the range of about 40 degrees to about 60 degrees. In the present embodiment, the angles $\theta_1$, $\theta_2$ take the values of about 146 degrees and about 56 degrees, respectively in the case the facets 220a, 230a, 220b, and 230b are formed by the (111) crystal plane of the substrate 202. However, it should be noted that the structure of FIG. 4 is not limited to the case in which the facets 220a, 230a, 220b, and 230b are formed by the (111) crystal plane.

Further, the bottom facet 220c is formed at a depth $D_1$ as measured from the surface 202s of the substrate 202, while the upper facet 220a is formed down to a depth $D_2$. In the structure of FIG. 4, the depth $D_1$ is in the range of about 20 nm to about 70 nm, while the depth $D_2$ is in the range of about 5 nm to about 60 nm. By optimizing the depth $D_2$ and a distance between the mutually opposing wedges 220w, 230w, it becomes possible to confine the uni-axial compressive stress of a strained material 222 (shown in FIG. 5) effectively to the channel region, thereby enhancing the device performance.

Figure 5:
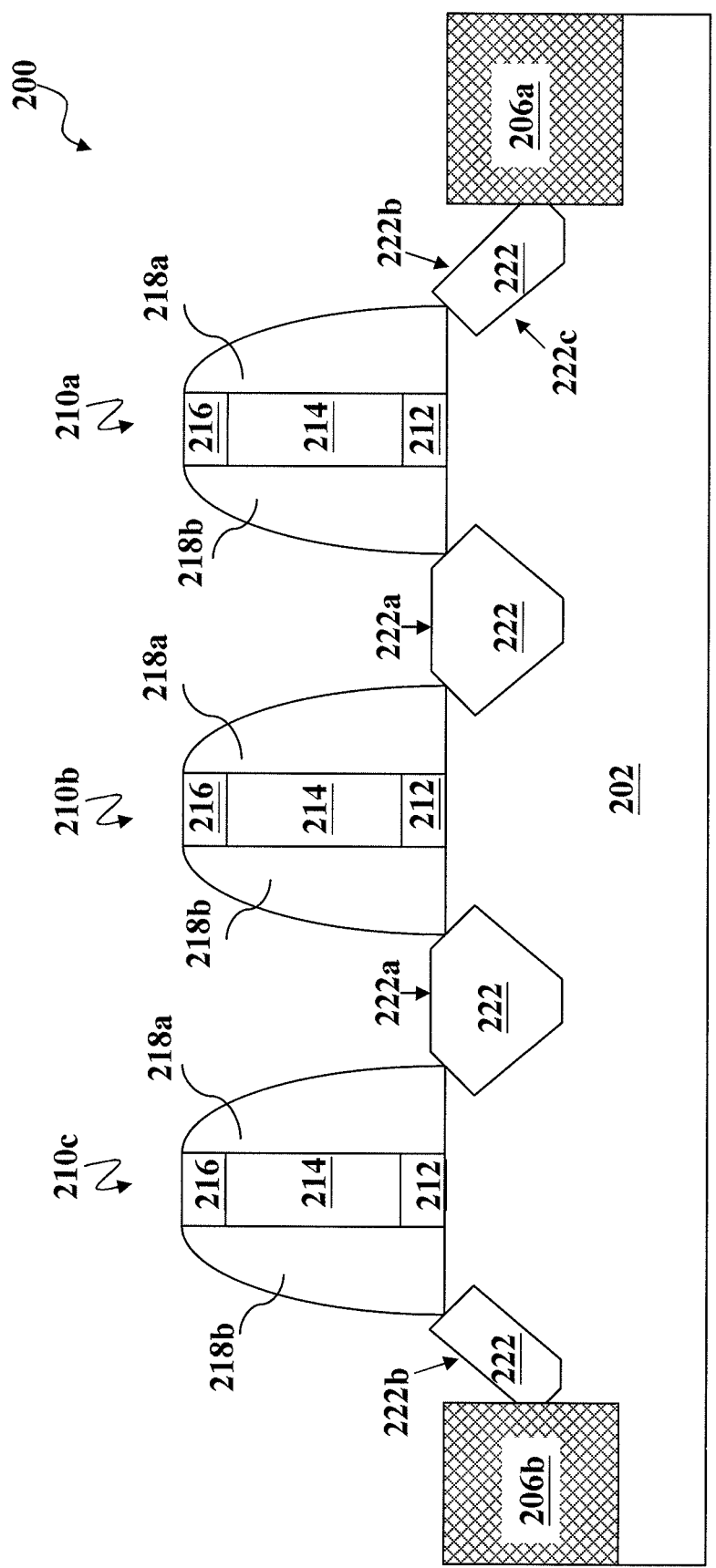

The process steps up to this point have provided the substrate 202 having the recess cavities 220, 230, 240, 250 adjacent to the gate stacks 210a, 210b, and 210c. Referring to FIGS. 1 and 5, the method 100 continues with step 108 in which a strained material 222 is grown in the recess cavities 220, 230, 240, 250 of the substrate 202 using a process including selective epitaxy growth (SEG), cyclic deposition and etching (CDE), chemical vapor deposition (CVD) techniques (e.g., vapor-phase epitaxy (VPE) and/or ultra-high vacuum CVD (UHV-CVD)), molecular beam epitaxy (MBE), other suitable epi processes, or combinations thereof. In some embodiments, the strained material 222 has a lattice constant different from the substrate 202 to induce a strain or stress on the channel region of the semiconductor device 200, and therefore enable carrier mobility of the device to enhance the device performance.

In the present embodiment, a pre-cleaning process is performed to clean the recess cavities 220, 230, 240, 250 using a chemical comprising hydrofluoric acid (HF) or other suitable solution. Then, gaseous and/or liquid precursors may be provided to interact with the composition of the substrate 202 to form the strained material 222, such as silicon germanium (SiGe), to fill the recess cavities 220, 230, 240, 250. In one embodiment, the process for forming the strained material 222 comprising SiGe is performed at a temperature of about 600° to 750° C. and under a pressure of about 10 Torr to about 80 Torr, using reaction gases comprising $SiH_2Cl_2$, HCl, $GeH_4$, $B_2H_6$, $H_2$, or combinations thereof. In some embodiments, a ratio of a mass flow rate of the $SiH_2Cl_2$ to a mass flow rate of the HCl is in the range of about 0.45 to 0.55. In one embodiment, the strained material 222 is therefore grown from the facets 230a, 230b, 230c, 230d, and 230e to the center of the recess cavity 230 in the substrate 202. In another embodiment, the strained material 222 is therefore grown from the facets 220a, 220b, 220c, and 220d to the center of the recess cavity 220 in the substrate 202.

In some embodiments, the growth of the strained material 222 in the recess cavity 230 that is not adjacent to the isolation structure 206a is mainly along the facet 230c and therefore has an upper surface 222a formed of (100) crystal plane. In the present embodiment, the growth of the strained material 222 in the recess cavity 220 that is adjacent to the isolation structure 206a is limited by the isolation structure 206a because the isolation structure 206a formed by a dielectric with an amorphous structure fails to offer nucleation sites to grow an epitaxial material. In some embodiments, the growth of the strained material 222 in the recess cavity 220 tends to have an upper surface 222b formed of (111) crystal plane with a stable surface energy. The strained material 222 in the recess cavity 220 has a lower sidewall surface 222c formed over the lower sidewall facet 220b and therefore is formed of (111) crystal plane. In some embodiments, the lower sidewall surface 222c is parallel to the upper surface 222b. It can be seen in FIG. 5 that the strained material 222 adjacent to the isolation structure 206a occupies a small portion of the recess cavity 220.

Figure 5A:
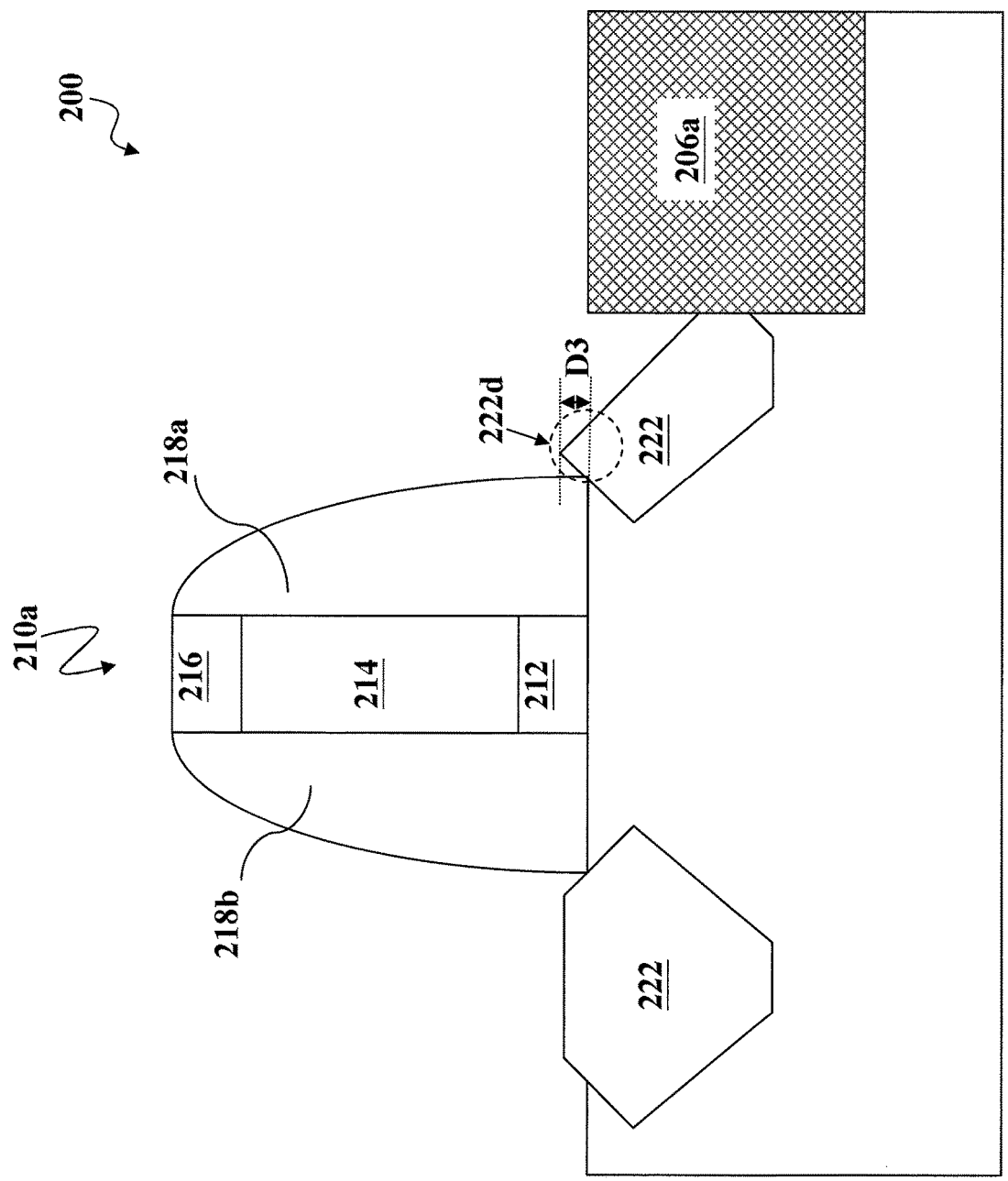

In FIG. 5A, the semiconductor device 200 is enlarged for better understanding of the profile of the strained material 222 in the recess cavity 220. In the present embodiment, the strained material 222 in the recess cavity 220 has a corner 222d adjacent to the edge of the gate stack 210a and having a tip higher than the surface 202s of the substrate 202. The corner 222d has a height D3 measured from the surface 202s to the tip of the corner 222d. In some embodiments, the height D3 ranges between about 1 nm and about 10 nm.

Figure 6:
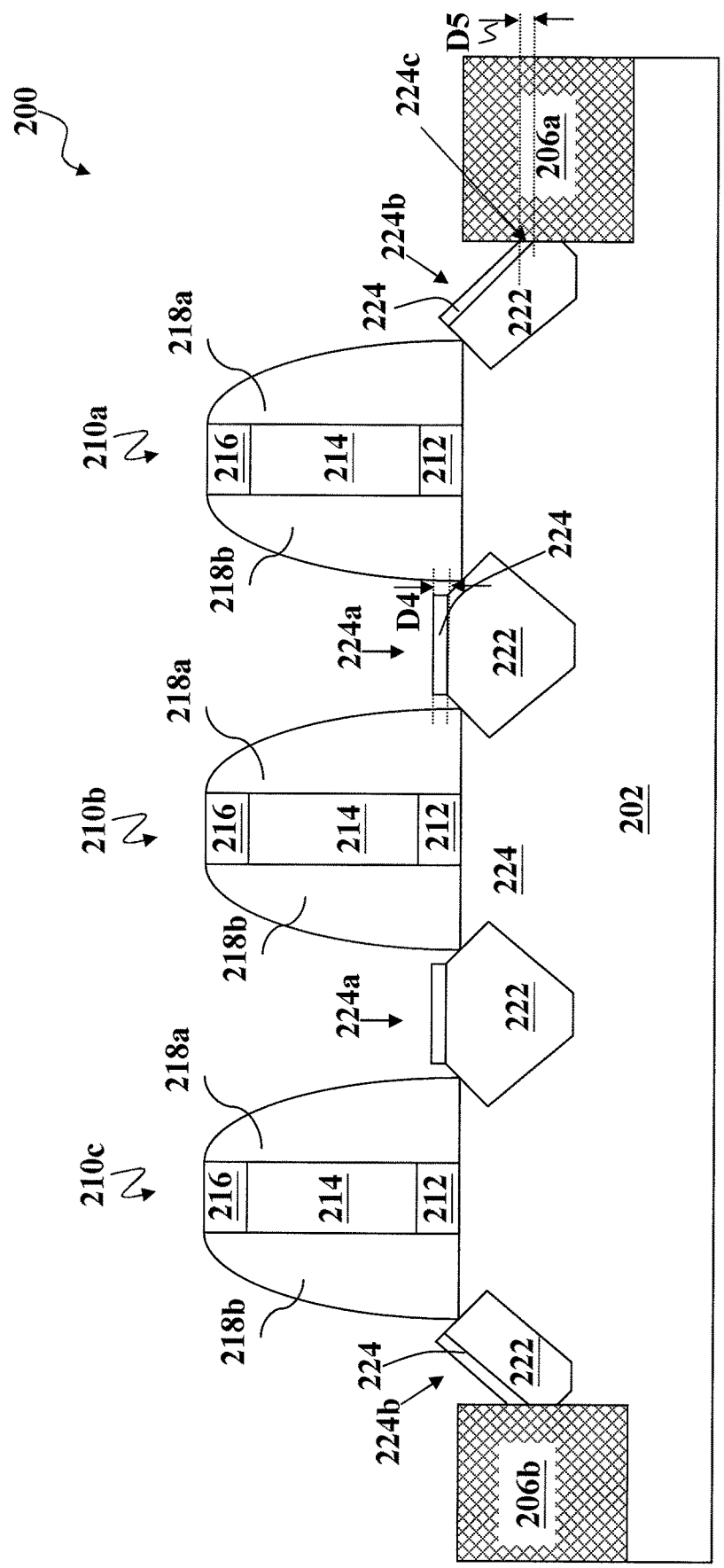

Referring to FIGS. 1 and 6, the method 100 continues with step 110 in which a cap layer 224 is formed over the strained material 222. In the present embodiment, the cap layer 224 is formed by an epi growth process. In some embodiments, the cap layer 224 functions as a protection layer to prevent undulation of the underlying strained material 222 in a subsequent treatment process. The cap layer 224 over the strained material 222 in the recess cavity 230, which is not adjacent to the isolation structure 206a, has a thickness D4. In some embodiments, the thickness D4 ranges between about 1 nm and about 5 nm. The cap layer 224 over the strained material 222 in the recess cavity 220 and adjacent to the isolation structure 206a has a sidewall 224c contacting the isolation structure 206a with a thickness D5. In some embodiments, a ratio of the thickness D4 over the thickness D5 ranges between about 1 nm and about 3 nm. In some embodiments, the cap layer 224 over the strained material 222 in the recess cavities 230 may grow along the crystal orientation of the upper surface 222a and has an upper surface 224a formed of (100) crystal plane. In some embodiments, the cap layer 224 over the strained material 222 in the recess cavities 220 may grow along the crystal direction of the upper surface 222b and has an upper surface 224b formed of (111) crystal plane.

In some embodiments, the cap layer 224 comprises a material different from the strained material 222. In some embodiments, the cap layer 224 is a silicon-containing layer. In the present embodiment, the cap layer 224 is silicon. In some embodiments, the cap layer 224 is formed by a process including selective epitaxy growth (SEG), cyclic deposition and etching (CDE), chemical vapor deposition (CVD) techniques (e.g., vapor-phase epitaxy (VPE) and/or ultra-high vacuum CVD (UHV-CVD)), molecular beam epitaxy (MBE), other suitable epi processes, or combinations thereof. In the present embodiment, the cap layer 224 is formed by a process same as to the process for forming the strained material 222. In some embodiments, the cap layer 224 is continuously formed after forming the strained material 222 by changing the process conditions to be performed at a temperature of about 700° C. to about 800° C., under a pressure of about 10 Torr to about 50 Torr, and using a silicon-containing gas (e.g., SiH$_2$Cl$_2$) as reaction gas. In an alternative embodiment, B$_2$H$_6$ and/or H$_2$ are introduced with the silicon-containing gas for forming the cap layer 224.

Figure 7:
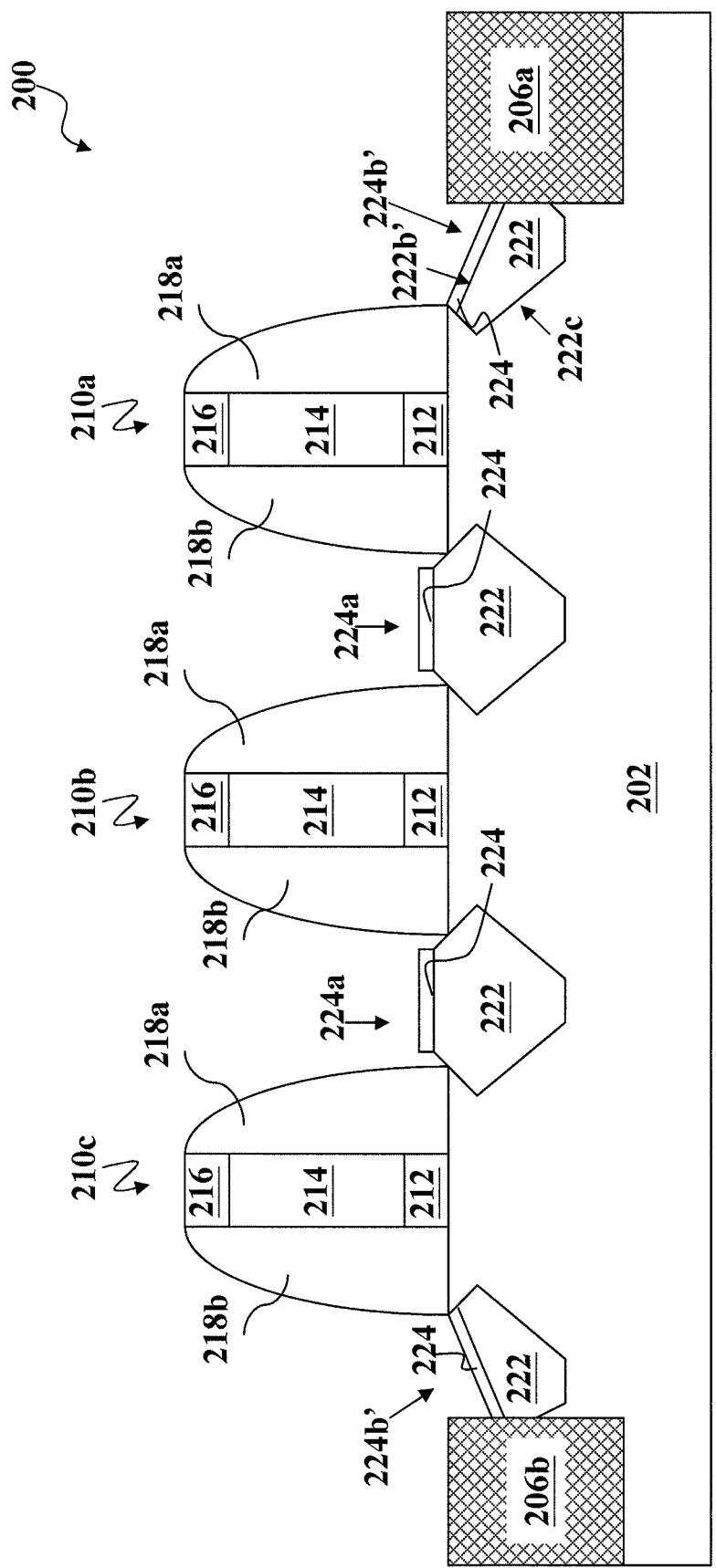

Referring to FIGS. 1 and 7, the method 100 continues with step 112 in which a treatment is provided to the semiconductor device 200. In some embodiments, the treatment is a heating process. In some embodiments, the treatment is performed at a temperature higher than the temperature for forming the cap layer 224 and/or the temperature for forming the strained material 222. In some embodiments, the treatment is performed at a temperature ranging between about 650° C. to about 850° C. In some embodiments, the treatment is performed under a pressure of about 10 Torr to about 50 Torr and lasting for a period of time not less than about 30 seconds. In some embodiments, a carrier gas (e.g., H$_2$) with a flow rate of about 35 slm to about 40 slm (standard liters per minute) is introduced in the treatment process for thermal conduction.

After the treatment process, in some embodiments, at least a portion of the corner 222d of the strained material 222 is redistributed in the recess cavity 220, thereby increasing an amount of the strained material 222 in the recess cavity 220. In one embodiment, the corner 222d above the surface 202s of the substrate 202 is completely redistributed in the recess cavity 220, therefore all the strained material 222 is within the recess cavity 220. The increased amount of the strained material 222 in the recess cavity 220 may fabricate a large-volume strained structure to enhance carrier mobility and upgrade the device performance of the semiconductor device 200.

In one embodiment, the redistribution results from reducing the high surface energy of the tip in corner 222d. In an alternative embodiment, the redistribution is results from a reflow process in the treatment. The original upper surface 222b of the strained material 222 in the recess cavity 220 is transformed into a treated upper surface 222b' after the treatment. In some embodiments, the treated upper surface 222b' has a transformed crystal plane which deviates from the original (111) crystal plane, therefore, the lower sidewall surface 222c of the strained material 222 is not parallel to the treated upper surface 222b'. In the present embodiment, the treated upper surface 222b' has a (311) crystal plane. Accordingly, the upper surface 224b of the overlying cap layer 224 may be transformed into a treated upper surface 224b'. In some embodiments, the treated upper surface 224b' is transformed from the original (111) crystal plane to the deviated-from (111) crystal plane. In the present embodiment, the treated upper surface 224b' has a (311) crystal plane. In some embodiments, the crystal orientation of the upper surface 222a of the strained material 222 in the recess cavity 230 is not changed after the treatment.

Figure 8:
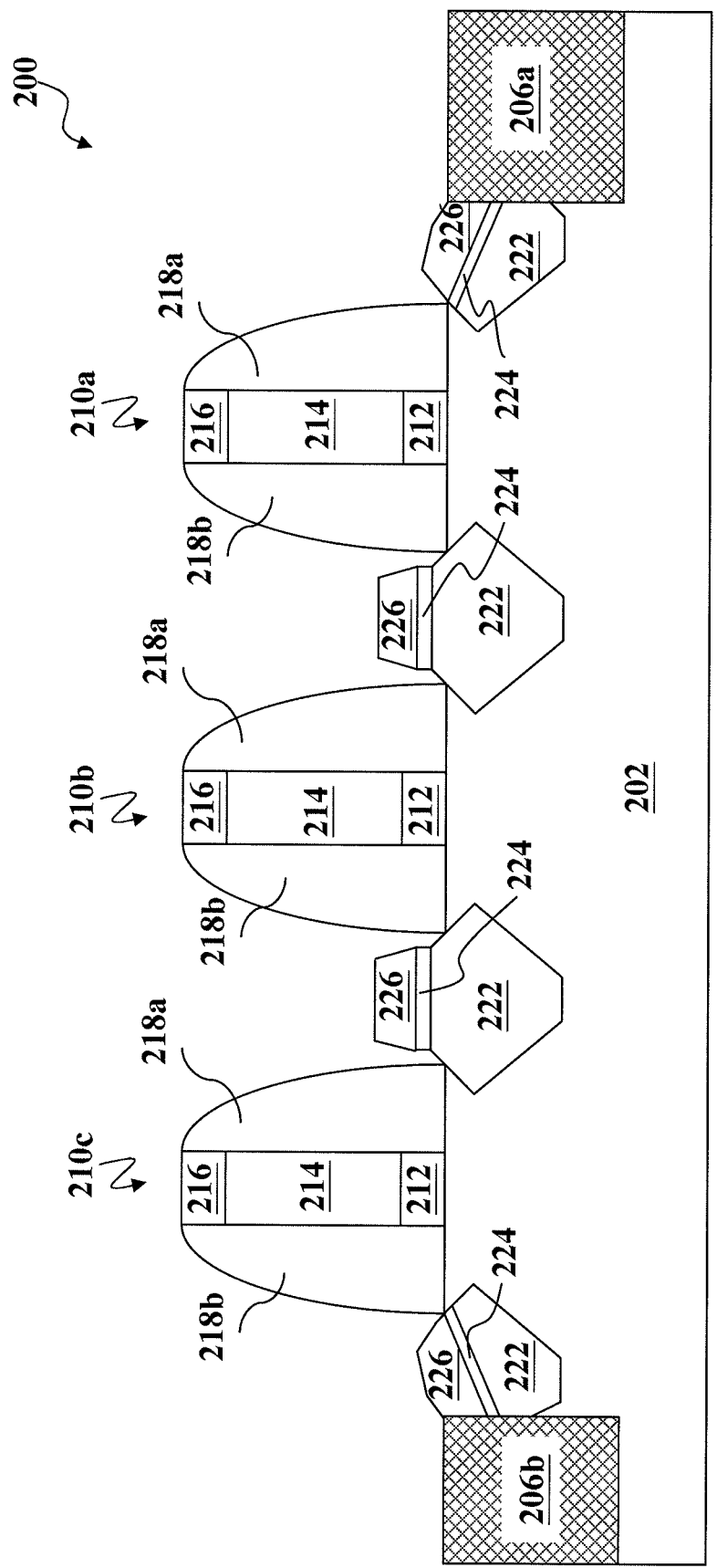

Referring to FIGS. 1 and 8, the method 100 continues with step 114 in which contact features 226 are formed over the cap layer 224. In the present embodiment, the contact features 226 are formed by a process that is the same as the process for forming the strained material 222 or the cap layer 224. The contact features 226 may provide a low contact resistance between the cap layer 224 and a silicide structure formed subsequently. In at least one embodiment, the contact features 226 have a thickness ranging from about 150 Angstroms to about 200 Angstroms. In some embodiments, the contact features 226 comprise a material that is the same as the material of cap layer 224. In alternative embodiments, the contact features 226 comprise a material same as to the material of strain material 222.

It is understood that the semiconductor device 200 may undergo further CMOS processes to form various features such as contacts/vias, interconnect metal layers, dielectric layers, passivation layers, etc. In some embodiments, the gate stacks 210a, 210b, 210c may be dummy gate stacks. Thus, the CMOS processes further comprise a "gate last" process to replace the polysilicon gate electrode with a metal gate electrode to improve device performance. In one embodiment, the metal gate electrode may include a metal such as Al, Cu, W, Ti, Ta, TiN, TiAl, TiAlN, TaN, NiSi, CoSi, other suitable conductive materials, or combinations thereof. It has been observed that the modified strained structure provides a given amount of strain into the channel region of a semiconductor device, thereby enhancing the device performance.

The various embodiments of the present disclosure discussed above offer advantages over previously known methods, it being understood that no particular advantage is required for all embodiments, and that different embodiments may offer different advantages. One of the advantages is that the lower portion of the strained material in the S/D recess cavity adjacent to the isolation structure may be increased to enhance carrier mobility and upgrade the device performance. Another advantage is that the likelihood of device instability and/or device failure resulting from forming a subsequent silicide over the lower portion of the strained material may be prevented.

One aspect of this description relates to a semiconductor device. The semiconductor device includes a first gate stack over a substrate. The semiconductor device further includes a first epitaxial (epi) material in the substrate, wherein the first epi material includes a first upper surface having a first crystal plane. The semiconductor device further includes a second epi material on the first epi material, wherein the second epi material includes a second upper surface having a second crystal plane, and the first crystal plane is different from the second crystal plane. The semiconductor device further includes a cap layer over the second epi material, wherein the cap layer extends above a top surface of the substrate. In some embodiments, the cap layer extends below the top surface of the substrate. In some embodiments, a material of the cap layer is a same material as the first epi material. In some embodiments, a thickness of the cap layer ranges from about 1 nanometer (nm) to about 5 nm. In some embodiments, the semiconductor device further includes a contact feature over the first epi material. In some embodiments, a thickness of the contact feature ranges from about 150 Angstroms to about 200 Angstroms. In some embodiments, a top surface of the first epi material is below a top surface of the substrate and at least a portion of a top surface of the second epi material is above the top surface of the substrate.

Another aspect of this description relates to a semiconductor device. The semiconductor device includes a first gate stack over a substrate. The semiconductor device further includes a strained source/drain (S/D) feature in the substrate, wherein the strained S/D feature is adjacent the first gate stack. The strained S/D feature includes a first epitaxial (epi) material in the substrate, wherein the first epi material includes a first upper surface having a first crystal plane. The strain S/D feature further includes a second epi material over the first epitaxial material, wherein the second epi material includes a second upper surface having a second crystal plane. In some embodiments, the semiconductor device further includes a contact feature over the second epi material. In some embodiments, a material of the contact feature is a same material as the first epi material. In some embodiments, a material of the contact feature is a same material as the second epi material. In some embodiments, the first upper surface has a (311) crystal plane.

Still another aspect of this disclosure relates to a semiconductor device. The semiconductor device includes a first gate stack over a substrate. The semiconductor device further includes a first epitaxial (epi) material in the substrate, wherein a first upper surface of the first epi material has a (111) crystal plane. The semiconductor device further includes a second epi material on the first epi material, wherein a second upper surface of the second epi material has a crystal plane different from the crystal plane of the first upper surface. In some embodiments, the second upper surface has a (311) crystal plane. In some embodiments, the semiconductor device further includes a second gate stack over the substrate, wherein the first gate stack is between the first epi material and the second gate stack. In some embodiments, the semiconductor device further includes a third epi material in the substrate on an opposite side of the first gate stack from the first epi material, wherein an upper surface of the third epi material has a crystal plane different from the crystal plane of the first upper surface. In some embodiments, the semiconductor device further includes a cap layer over the second epi material. In some embodiments, the semiconductor device further includes a contact feature over the cap layer. In some embodiments, a material of the cap layer is a same material as the contact feature. In some embodiments, a material of the first epi material is a same material as the contact feature.

While the disclosure has described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
    a first gate stack over a substrate;
    a first epitaxial (epi) material in the substrate, wherein the first epi material includes a first upper surface having a first crystal plane, and a first lower surface of the first epi material has a second crystal plane; and
    a second epi material on the first epi material, wherein the second epi material includes a second upper surface having the second crystal plane, and the first crystal plane is different from the second crystal plane.

2. The semiconductor device of claim 1, wherein the second epi material extends below the top surface of the substrate.

3. The semiconductor device of claim 1, wherein a material present in the first epi material is absent from the second epi material.

4. The semiconductor device of claim 1, wherein a thickness of the second epi material ranges from about 1 nanometer (nm) to about 5 nm.

5. The semiconductor device of claim 1, further comprising a contact feature over the first epi material.

6. The semiconductor device of claim 5, wherein a thickness of the contact feature ranges from about 150 Angstroms to about 200 Angstroms.

7. The semiconductor device of claim 1, wherein a top surface of the first epi material is below a top surface of the substrate and at least a portion of a top surface of the second epi material is above the top surface of the substrate.

8. A semiconductor device comprising:
    a first gate stack over a substrate;
    a strained source/drain (S/D) feature in the substrate, wherein the strained S/D feature is adjacent the first gate stack, wherein the strained S/D feature comprises:
        a first epitaxial (epi) material in the substrate, wherein the first epi material includes a first upper surface having a first crystal plane, and the first epi material includes a first lower surface having a second crystal plane different from the first crystal plane; and
        a second epi material over the first epitaxial material, wherein the second epi material includes a second upper surface having a third crystal plane different from the first crystal plane.

9. The semiconductor device of claim 8, further comprising a contact feature over the second epi material.

10. The semiconductor device of claim 9, wherein a material of the contact feature is a same material as the first epi material.

11. The semiconductor device of claim 9, wherein a material of the contact feature is a same material as the second epi material.

12. The semiconductor device of claim 8, wherein the first upper surface has a (311) crystal plane.

13. A semiconductor device, comprising:
    a first gate stack over a substrate;
    a first epitaxial (epi) material in the substrate, wherein a first upper surface of the first epi material has a (111) crystal plane; and
    a second epi material on the first epi material, wherein a second upper surface of the second epi material has a (311) crystal plane.

14. The semiconductor device of claim 13, wherein the first epi material has a first lower surface having a crystal plane different from the first upper surface.

15. The semiconductor device of claim 13, further comprising a second gate stack over the substrate, wherein the first gate stack is between the first epi material and the second gate stack.

16. The semiconductor device of claim 13, further comprising a third epi material in the substrate on an opposite side of the first gate stack from the first epi material, wherein an upper surface of the third epi material has a crystal plane different from the crystal plane of the first upper surface.

17. The semiconductor device of claim 13, further comprising a cap layer over the second epi material.

18. The semiconductor device of claim 17, further comprising a contact feature over the cap layer.

19. The semiconductor device of claim 18, wherein a material of the cap layer is a same material as the contact feature.

20. The semiconductor device of claim 18, wherein a material of the first epi material is a same material as the contact feature.

* * * * *